(12) United States Patent
March et al.

(10) Patent No.: US 12,550,475 B2
(45) Date of Patent: Feb. 10, 2026

(54) HIGH PERFORMANCE PEROVSKITE SOLAR CELLS, MODULE DESIGN, AND MANUFACTURING PROCESSES THEREFOR

(71) Applicant: Rayleigh Solar Tech Inc., Dartmouth (CA)

(72) Inventors: Samuel March, Dartmouth (CA); Irina Valitova, Halifax (CA); Dane George, Halifax (CA); Ajan Ramachandran, Halifax (CA)

(73) Assignee: Rayleigh Solar Tech Inc., Dartmouth (CA)

( * ) Notice: Subject to any disclaimer, the term of this patent is extended or adjusted under 35 U.S.C. 154(b) by 0 days.

(21) Appl. No.: 17/799,390

(22) PCT Filed: Feb. 12, 2021

(86) PCT No.: PCT/CA2021/050155
§ 371 (c)(1),
(2) Date: Aug. 12, 2022

(87) PCT Pub. No.: WO2021/159214
PCT Pub. Date: Aug. 19, 2021

(65) Prior Publication Data
US 2023/0119125 A1    Apr. 20, 2023

Related U.S. Application Data

(60) Provisional application No. 62/975,590, filed on Feb. 12, 2020.

(51) Int. Cl.
*H10F 77/169* (2025.01)
*H10K 30/50* (2023.01)
(Continued)

(52) U.S. Cl.
CPC ......... *H10F 77/1698* (2025.01); *H10K 30/50* (2023.02); *H10K 77/111* (2023.02); *H10K 85/50* (2023.02); *H10K 39/18* (2023.02)

(58) Field of Classification Search
CPC .................................................. H01G 9/2081
See application file for complete search history.

(56) References Cited

U.S. PATENT DOCUMENTS 8,886,334 B2    11/2014   Ghaffari et al.
2001/0045228 A1 11/2001   Takada et al.
(Continued)

FOREIGN PATENT DOCUMENTS

CN    105609642 A    5/2016
CN    106229327 A    12/2016
(Continued)

OTHER PUBLICATIONS

Machine translation of CN111048608A (Year: 2020).*
(Continued)

*Primary Examiner* — Ryan S Cannon
(74) *Attorney, Agent, or Firm* — Philip D. Askenazy; Peacock Law P.C.

(57) ABSTRACT

High-performance perovskite solar cell (PSC) devices, arrays thereof, and modules manufactured on flexible and stretchable substrates using roll-to-roll high throughput manufacturing techniques. The flexible cells can be cut into strips and are connected via flexible and/or stretchable interconnects. The interconnect can be a layer deposited on a wavy surface of the stretchable substrate, a coiled or hinged wire, or a conductive paste that can be deformed prior to curing. The highly deformable solar modules can conform to complex organic contours and shapes, such as
(Continued)

those that are common in vehicle designs. Such shapes typically require at least one axis of flex and at least one axis of stretch.

25 Claims, 6 Drawing Sheets

(51) Int. Cl.
  *H10K 77/10* (2023.01)
  *H10K 85/50* (2023.01)
  *H10K 39/18* (2023.01)

(56) References Cited

U.S. PATENT DOCUMENTS

| | | | |
|---|---|---|---|
| 2014/0144480 A1 | 5/2014 | Lee | |
| 2014/0283892 A1* | 9/2014 | Lee | H01G 9/2081 438/73 |
| 2016/0196927 A1* | 7/2016 | Bryant | H10K 39/10 438/66 |
| 2017/0301479 A1 | 10/2017 | Moehl et al. | |
| 2017/0331069 A1 | 11/2017 | Song et al. | |
| 2017/0358693 A1* | 12/2017 | Moon | H10F 10/163 |
| 2018/0114874 A1* | 4/2018 | Aranami | H01L 31/035272 |
| 2018/0358571 A1 | 12/2018 | Choi et al. | |
| 2019/0058436 A1 | 2/2019 | Atchley et al. | |
| 2019/0221692 A1 | 7/2019 | Wang | |
| 2020/0035778 A1 | 1/2020 | Kim et al. | |
| 2020/0176622 A1* | 6/2020 | Kim | H10F 10/162 |

FOREIGN PATENT DOCUMENTS

| | | | | |
|---|---|---|---|---|
| CN | 108428797 A | | 8/2018 | |
| CN | 108551312 A | | 9/2018 | |
| CN | 109148688 A | | 1/2019 | |
| CN | 109273610 A | | 1/2019 | |
| CN | 111048608 A | * | 4/2020 | H01L 31/022433 |
| EP | 3496160 A1 | | 6/2019 | |
| JP | 2019029573 A | * | 2/2019 | H01L 51/0096 |
| KR | 101899253 B1 | | 10/2018 | |
| KR | 102085484 B1 | | 5/2020 | |
| TW | 201911616 A | | 3/2019 | |
| WO | 2008030960 A2 | | 3/2008 | |
| WO | 2018232324 A1 | | 12/2018 | |
| WO | 2019000641 A1 | | 1/2019 | |
| WO | WO-2020243287 A1 | * | 12/2020 | C07C 211/62 |

OTHER PUBLICATIONS

Machine translation of JP2019/029573A (Year: 2019).*
Chang, Wei-Chieh , et al., "Controlled Deposition and Performance Optimization of Perovskite Solar Cells Using Ultrasonic Spray-Coating of Photoactive Layers", ChemSusChem, vol. 10, 2017, 1406-1512.
Du, Tian , et al., "Light-intensity and thickness dependent efficiency of planr perovskite solar cells: charge recombination versus extraction", Journal of Materials Chemistry C, vol. 8, The Royal Society of Chemistry, 2020, 12648-12655.
Galagen, Yulia , et al., "Roll-to-Roll Slot Die Coated Perovskite for Efficient Flexible Solar Cells", Adv. Energy Mater., vol. 8, 2018, 1801935-1-7.
Heo, Youn-Jung , et al., "Printing-friendly sequential deposition via intra-additive approach for roll-to-roll process of perovskite solar cells", Nano Energy, vol. 41, Elsevier Ltd., Nov. 1, 2017, 443-451.
Jung, Yen-Sook , et al., "Progress in Scalable Coating and Roll-to-Roll Compatible Printing Processes of Perovskite Solar Cells Toward Realization of Commercialization", Advanced Optical Materials, vol. 6, Wiley-VCH Verlag GmbH & Co., KGaA, Weinheim, May 1, 2018, 17011182.
Kostopoulou, Athanasia , et al., "Perovskite nanocrystals for energy conversion and storage", Nanophotonics, vol. 8, No. 10, De Gryter, 2019, 1607-1640.
Li, Daiyu , et al., "A Review on Scaling Up Perovskite Solar Cells", Advanced Functional Materials, Wiley-VCH GmbH, 2020, 2008621.
Tzounis, L. , et al., "Perovskite solar cells from small scale spin coating process towards roo-to-roll printing: Optical and Morphological studies", Materials Today: Proceedings, vol. 4, Elsevier Ltd., Jan. 1, 2017, 5082-5089.
Wang, Kai , et al., "Efficiencies of perovskite hybrid solar cells influenced by film thickness and morphology of CN3NH3PbI3-xCLx layer", Organic Electronics, vol. 21, Elsevier B.V., 2015, 19-26.
Yang, Dong , et al., "Recent Advances in Flexible Perovskite Solar Cells: Fabrication and Applications", Angewandte Chemie (International Ed. in English), vol. 58, Mar. 26, 2019, 4467-4483.
Zhao, Yicheng , et al., "Strain-activated light-induced halide segregation in mixed-halide perovskite solids", Nature Communications, https://doi.org/10.1038/s41467-020-20066-7, 2020.
Zi, Wei , et al., "Flexible perovskite solar cells based on green, continuous roll-to-roll printing technolgoy", Journal of Energy Chemistry, vol. 27, Science Press and Dalian Institute of Chemical Physics, Chinese Academy of Sciences, Jul. 1, 2018, 971-989.
Galagan, Yulia, et al., "Roll-to-Roll Slot Die Coated Perovskite for Efficient Flexible Solar Cells", Adv. Energy Mater. 8, 1801935 (pp. 1-7 and Supplementary Material, pp. 1-7), 2018.

* cited by examiner

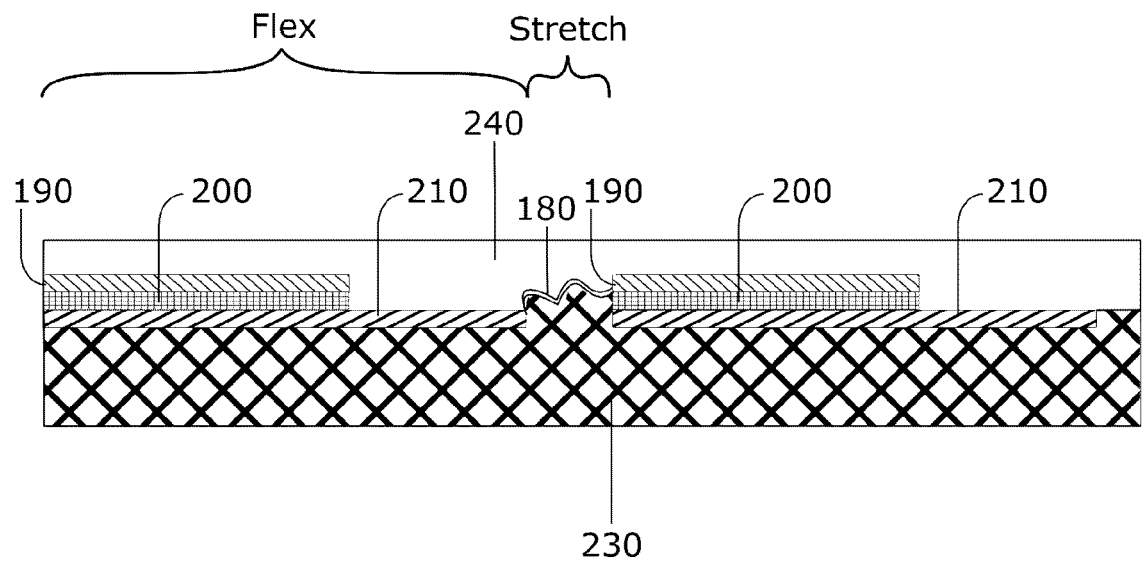
FIG. 3
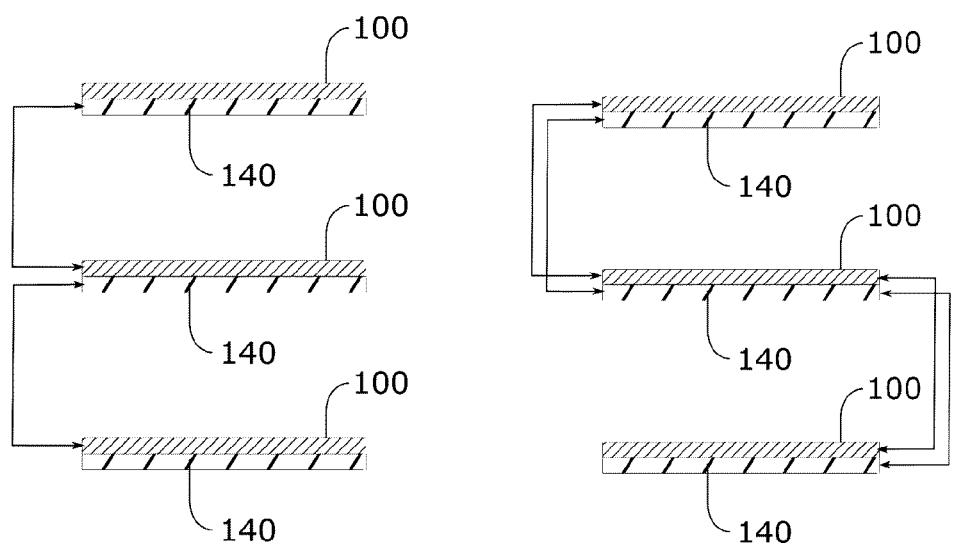
FIG. 4A  FIG. 4B

HIGH PERFORMANCE PEROVSKITE SOLAR CELLS, MODULE DESIGN, AND MANUFACTURING PROCESSES THEREFOR

CROSS-REFERENCE TO RELATED APPLICATIONS

This application claims priority to and the benefit of the filing of U.S. Provisional Patent No. 62/975,590, entitled "High Performance Perovskite Solar Cells, Module Design, and Manufacturing Processes Therefor", filed on Feb. 12, 2020, the entirety of which is incorporated herein by reference.

BACKGROUND OF THE INVENTION

Field of the Invention (Technical Field)

The present invention is related to high performance flexible perovskite solar cells (PSCs) and flexible/stretchable PSC modules that take advantage of high-throughput manufacturing processes.

BACKGROUND ART

Note that the following discussion may refer to a number of publications and references. Discussion of such publications herein is given for more complete background of the scientific principles and is not to be construed as an admission that such publications are prior art for patentability determination purposes.

Conventional solar cells are made from brittle crystalline semiconductors that crack when flexed. Some solar cell materials, including many PSC materials, exist that are flexible to a certain degree. PSCs can be manufactured using all-low-temperature processing (below 150 deg C.) that allows the cells to be fabricated on flexible substrates. The fabrication of flexible PSCs is well known in the art, although a method for manufacturing PSC modules that can form-fit to complex, or organic, contoured surfaces is still lacking. In order to accomplish this novel application of PSCs, a degree of stretch can be integrated into the PSC module design.

PSCs suffer from high series resistance due to the high sheet resistance of transparent conductive oxides (TCO). To reduce this series resistance perovskite cells are typically series connected via sequential laser scribing and deposition processes, or by depositing an underlayer of metal on the TCO. Both of these methods for reducing series resistance are well known in the art. Although these methods reduce the series resistance of the TCO, neither method can be incorporated into a module design that can be flexible in more than one direction or that is stretchable, both of which features (at least 1 degree of flex and at least 1 degree of stretch) are necessary to form-fit to organic contours. The development of stretchable conductive interconnects is well known in the art, but a design for interconnecting PSCs into a flexible/stretchable module is lacking.

In order to facilitate the growing potential of solar as an economical alternative to fossil-fuels, the potential applications must grow. A largely untapped industry for solar implementation is the auto industry. The auto industry is responsible for 23% of $CO_2$ gas emissions and 20% of energy use worldwide. The electric vehicle (EV) market aims to substitute electric alternatives to fossil-fuel based engines. The key advantage to electric powered engines is that the batteries that power the car can be recharged using sustainable sources of energy, leading to a potential global reduction in $CO_2$ production. In order to increase the feasibility of solar EV's, the portion of a vehicle's surface which a solar panel can be applied to must increase, and consequently, the solar module must shape to the complex 'organic' contours that are common in modern automobile design. To facilitate this design requirement, solar modules must be flexible in more than one direction, and stretchable in at least one direction.

SUMMARY OF THE INVENTION (DISCLOSURE OF THE INVENTION)

An embodiment of the present invention is a flexible and stretchable solar module comprising a first flexible perovskite solar cell and a second flexible perovskite solar cell disposed on a stretchable substrate; and a deformable interconnect electrically connecting the first flexible perovskite solar cell and second flexible perovskite solar cell. The stretchable substrate preferably comprises polydimethylsiloxane (PDMS) or vinyl. The solar module is preferably capable of conforming to a contoured surface of an object. Each of the solar cells preferably comprises a flexible substrate coated with a transparent conductive oxide (TCO) layer, which is preferably selected from the group consisting of indium tin oxide (ITO), silver nanowires, single-layer graphene, graphene nanoplates, and combinations thereof. Preferably an exposed portion of the TCO layer on each solar cell is not covered by overlaying layers of the solar cell. Each of the solar cells was preferably manufactured using slot-die coating. The exposed portion of the TCO layer is between approximately 1 μm and approximately 10 mm wide, more preferably approximately 1 mm wide. Each solar cell preferably comprises a metal contact disposed on at least a part of the exposed portion of the TCO layer. The metal contact was preferably disposed on the exposed portion of the TCO layer by metal evaporation using a mask, screen printing, or attaching the metal contact to the exposed portion of the TCO layer with an electrically conductive adhesive tape. The exposed portion of the TCO layer is optionally formed by removing the overlaying layers over the exposed portion of the TCO layer by mechanical etching or laser scribing. The overlaying layers preferably comprise an electron transport layer (ETL), a perovskite layer, a hole transport layer (HTL), and a conductive layer. The deformable interconnect can electrically connect the metal contact on the first flexible perovskite solar cell to the metal contact on the second flexible perovskite solar cell, the conductive layer on the first flexible perovskite solar cell to the conductive layer on the second flexible perovskite solar cell, and/or the metal contact on the first flexible perovskite solar cell to the conductive layer on the second flexible perovskite solar cell.

The deformable interconnect preferably is flexible and/or stretchable. In some embodiments a portion of the stretchable substrate preferably extends vertically between the first flexible perovskite solar cell and the second flexible perovskite solar cell. The portion of the stretchable substrate is preferably between about 1 mm and about 10 mm in width and preferably comprises a wavy surface. A first side of the wavy surface is preferably approximately adjacent to a first contact on the first flexible perovskite solar cell and a second side of the wavy surface is preferably approximately adjacent to a second contact on the second flexible perovskite solar cell. In this case the deformable interconnect preferably comprises a layer of conductive material deposited on the wavy surface, thereby electrically connecting the first contact and the second contact. Alternatively, the deformable interconnect comprises a coiled metal wire, a hinged metal wire, a flexible and/or stretchable conductive contact, or a hinged metal connector. The solar module preferably further comprises a stretchable cover layer encapsulating the first flexible perovskite solar cell, the second flexible perovskite solar cell, and the deformable interconnect.

In some embodiments the deformable interconnect preferably comprises a conductive paste disposed between the first flexible perovskite solar cell and the second flexible perovskite solar cell. The conductive paste preferably electrically connects the exposed portion of the TCO on the first flexible perovskite solar cell and the exposed portion of the TCO on the second flexible perovskite solar cell. The exposed portion of the TCO layer on the first flexible perovskite solar cell and the exposed portion of the TCO layer on the second flexible perovskite solar cell preferably spatially overlap but are preferably not in physical contact. For each of the solar cells, perovskite forming a perovskite layer is preferably extended to electrically insulate from the conductive paste those layers of the solar cell which are not adjacent to the TCO layer. In serially connected embodiments the order of layers in each solar cell is preferably the same, but the exposed portion of the TCO layer in the first flexible perovskite solar cell is preferably facing downward from a top portion of the first flexible perovskite solar cell and the exposed portion of the TCO layer in the second flexible perovskite solar cell is preferably facing upward from a bottom portion of the second flexible perovskite solar cell. In parallel connected embodiments the first flexible perovskite solar cell is preferably inverted on the stretchable substrate with respect to the second flexible perovskite solar cell so that the positions of an HTL and an ETL in the first flexible perovskite solar cell are preferably exchanged with respect to positions of an HTL and an ETL in the second flexible perovskite solar cell. The solar module preferably further comprises a stretchable layer covering the first flexible perovskite solar cell, the second flexible perovskite solar cell, and the conductive paste, and is preferably conformed to a contoured surface prior to curing of the conductive paste.

An embodiment of the present invention is a method of manufacturing a flexible and stretchable solar cell, the method comprising: producing first and second flexible perovskite solar cells, each cell comprising an exposed portion of a TCO layer on a bottom of the solar cell and a conductive layer on the top of the solar cell; disposing a metallic contact on at least a part of exposed portion of the TCO layer on each of the solar cells; placing the first flexible perovskite solar cell and the second flexible solar cell on a stretchable substrate; and electrically connecting the first flexible perovskite solar cell and the second flexible solar cell with a deformable interconnect. The stretchable substrate preferably comprises PDMS or vinyl. The producing step preferably comprises slot-die coating, or alternatively comprises removing layers overlaying the TCO layer using mechanical etching or laser scribing to produce the exposed portion of the TCO layer on each of the flexible perovskite solar cells. The electrically connecting step preferably comprises connecting the metal contact on the first flexible perovskite solar cell to the metal contact on the second flexible perovskite solar cell, connecting the conductive layer on the first flexible perovskite solar cell to the conductive layer on the second flexible perovskite solar cell, and/or connecting the metal contact on the first flexible perovskite solar cell to the conductive layer on the second flexible perovskite solar cell. In some embodiments the placing step preferably comprises indenting the first flexible perovskite solar cell and the second flexible perovskite solar cell into the stretchable substrate prior to curing of the stretchable substrate so that a portion of the stretchable substrate extends vertically between the first flexible perovskite solar cell and the second flexible perovskite solar cell. The method preferably comprising producing a wavy pattern on a surface of the portion of the stretchable substrate, preferably by stamping, chemical etching, or molding. The electrically connecting step preferably comprises depositing a layer of conductive material on the wavy-patterned surface of the portion of the stretchable substrate, thereby connecting a contact on the first flexible perovskite solar cell with a contact on the second flexible perovskite solar cell. The method preferably further comprises encapsulating the first flexible perovskite solar cell, the second flexible perovskite solar cell, and the deformable interconnect in a stretchable cover layer. The disposing step preferably comprises metal evaporation using a mask, screen printing, or attaching the metal contact to the portion of the TCO layer with an electrically conductive adhesive tape.

In other embodiments the electrically connecting step preferably comprises disposing a conductive paste between the first flexible perovskite solar cell and the second flexible perovskite solar cell. The conductive paste preferably electrically connects the exposed portion of the TCO on the first flexible perovskite solar cell and the exposed portion of the TCO on the second flexible perovskite solar cell. The method preferably comprises spatially overlapping but not directly contacting the exposed portion of the TCO on the first flexible perovskite solar cell and the exposed portion of the TCO on the second flexible perovskite solar cell. The placing step optionally comprises inverting the first flexible perovskite solar cell with respect to the second flexible perovskite solar cell. The method preferably further comprises covering the solar module with a stretchable cover layer; conforming the solar module to a contoured surface of an object; and curing the conductive paste.

Objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate the practice of embodiments of the present invention and, together with the description, serve to explain the principles of the invention. The drawings are only for the purpose of illustrating certain embodiments of the invention and are not to be construed as limiting the invention. In the drawings:

FIG. 3 shows the interconnection scheme in more detail where the perovskite cell is positioned on a stretchable underlayer that has been molded in the connection region. The conductive material contact is then deposited on the wavy stretchable region interconnecting the individual cells. Finally, an encapsulating layer of stretchable material is coated on top of the conductive contact.

FIG. 4A shows an interconnection scheme for series connections.

FIG. 4B shows an interconnection scheme for parallel connections.

FIG. 9A shows an example of a 2-axis organic contour. FIG. 9B shows an application comprising two dimensional organic contours.

DETAILED DESCRIPTION OF EMBODIMENTS OF THE INVENTION

Embodiments of the present invention are arrays of interconnected photovoltaic PCSs. The PSCs preferably comprise a narrow strip of flexible PSC that has been cut from a larger PSC that preferably has been manufactured using high throughput roll-to-roll manufacturing processes. The cells are each preferably between about 1 mm and 10 mm wide, and their length is preferably between about 1 cm and 1 m. Each cell is preferably sufficiently narrow to accommodate the design constraints of the contour that it will be applied to. Two embodiments of the present invention are methods of manufacturing stretchable interconnections for PSCs enabling them to cover complex contoured surfaces. The present invention provides several valuable improvements to solar module structures, including the combination of flexible solar cells interconnected into an array of series and/or parallel connected cells using flexible and stretchable mechanical/conductive interconnections, as well as using high throughput manufacturing techniques to fabricate the solar cells and solar modules. The preferable flexible and/or stretchable interconnection of thin strips of PSCs embedded in a flexible carrier substrate both reduces the inherent series resistance in the PSCs and increases the deformability of the module. This design results in the potential to form-fit a solar module to complex organic contoured surfaces.

Figure 1:
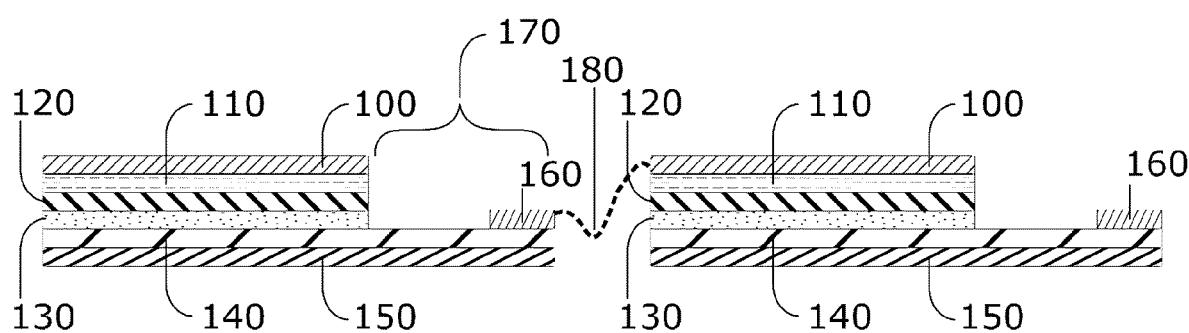
FIG. 1 is a schematic showing the PSC device architecture after interconnection using method 1, where the interconnect is preferably a layer of conductive material deposited on the stretchable carrier substrate.
Figure 2:
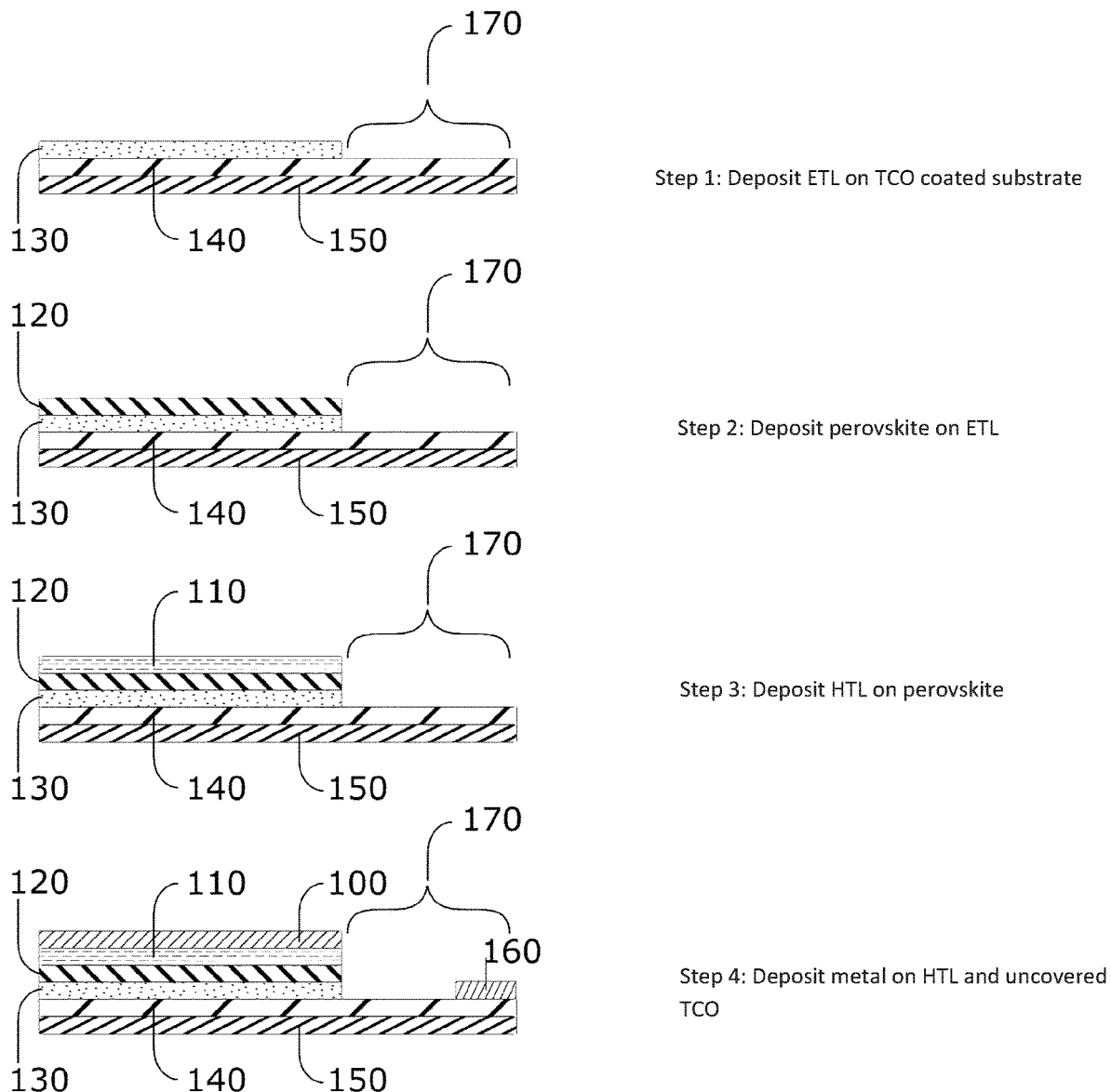
FIG. 2 shows the manufacturing process of PSCs including the steps required to prepare the substrate for interconnection.

FIG. 1 illustrates an exemplary device architecture of two PSCs connected in series constructed in accordance with a first embodiment of the present invention. Each PSC preferably comprises flexible carrier substrate 150, transparent conductive oxide (TCO) layer 140, electron transport layer (ETL) 130, perovskite layer 120, hole transport layer (HTL) 110, conductive layer 100, and electrical contact 160 on TCO layer 140. FIG. 2 shows an example of the fabrication steps for the device shown in FIG. 1. First, ETL 130 is deposited on carrier substrate 150 coated with at least one TCO layer 140. Carrier substrate 150 may comprise any material, including but not limited to polyethylene terephthalate (PET). TCO layers 140 may comprise, for example, indium tin oxide (ITO), silver nanowires, single-layer graphene, graphene nanoplates, and/or combinations thereof, together with carrier substrate 150 preferably forming a transparent, flexible, and conductive composite substrate. ETL 130 may comprise any material, including but not limited to a transition metal oxide such as $TiO_2$, $SnO_2$, ZnO, $In_2O_3$, $Ga_2O_3$, or CdO, and may be deposited by a method such as spin-coating, slot-die coating, air-blade coating, doctor-blade coating, sputtering, e-beam evaporation, or chemical bath deposition, in which any heat treatment does not exceed the melting temperature of the carrier substrate 150 or TCO layer 140. Perovskite layer 120 is then preferably deposited on ETL 130 by a method such as spin-coating, slot-die coating, air-blading, spray-coating, or blade-coating, which method preferably does not comprise a heat treatment exceeding the melting temperature of any of the underlying layers. Perovskite layer 120 preferably comprises the ABX3 structure, where A is a cation comprising, for example, methylammonium, formamidinium, cesium, or rubidium; B is a cation comprising, for example, lead or tin; and X is an anion comprising, for example, an iodide, bromide or chloride. HTL 110 is then preferably deposited on perovskite layer 120 by a method such as spin-coating, slot-die coating, air-blading, spray-coating, or blade-coating, which method preferably does not comprise a heat treatment exceeding the melting temperature of any of the underlying layers. HTL 110 preferably comprises 2,2',7,7'-Tetrakis[N,N-di(4-methoxyphenyl)amino]-9,9'-spirobifluorene (spiro-OMeTAD), [6,6]-phenyl C61 butyric acid methyl ester (PCBM), or a graphite slurry that includes additives such as carbon black to increase the conductivity. If HTL 110 is not sufficiently conductive, optional conductive layer 100 may be deposited on HTL 110 for forming the top electrical contact to the PSC.

The PSCs of the present invention are preferably processed in strips that provide access to both the top contact (conductive layer 100) and bottom contact (TCO layer 140), i.e., leaving strip 170 of TCO layer 140 uncovered by ETL 130, perovskite layer 120, HTL 110, and conductive layer 100. This is preferably accomplished by processing ETL 130, perovskite layer 120, HTL 110, and conductive layer 100 in strips using slot-die coating, which can be configured to leave strip 170 of TCO-coated carrier substrate 150 uncoated. Alternatively, mechanical etching or laser scribing can be used to remove ETL 130, perovskite layer 120, HTL 110, and conductive layer 100 to create strip 170. Strip 170 is preferably approximately between 1 μm and 10 mm wide, and more preferably about 1 mm wide. Electrical contact 160 is then deposited or attached to a portion of uncovered strip 170 of TCO layer 140 to form the bottom electrical contact to the PSC. Electrical contact 160 is preferably disposed on TCO layer 140 using a method including but not limited to metal evaporation using a mask, screen printing, or attaching the contact via an electrically conductive adhesive tape. Stretchable interconnection 180, which is preferably also flexible, is formed between electrical contact 160 and optional conductive layer 100.

As shown in FIG. 3, the cells are then placed on a stretchable substrate 230, which preferably comprises polydimethylsiloxane (PDMS). In FIG. 3, to simplify the drawing, layer 190 represents optional conductive layer 100, layer 200 represents ETL 130, perovskite layer 120, and HTL 110, and layer 210 represents carrier substrate 150 coated with TCO layer 140, including uncoated strip 170 and electrical contact 160. The gap between the cells is preferably between about 1 mm and about 10 mm. In this gap, stretchable substrate 230 preferably extends above layer 210 and layer 200, and its surface preferably comprises a wavy pattern such as that shown in FIG. 3. The wavy pattern may be produced by a method such as stamping, chemical etch, pouring the stretchable substrate into a mold, or by any other means. The height of the stretchable substrate in the gap is preferably extended above the cells by laying down the cells on the stretchable substrate when it is soft before curing and pressing the cells down. Stretchable interconnection 180 preferably comprises a thin layer of conductive material, preferably between approximately 1 nm and 1000 nm in thickness, that is preferably deposited on electrical contact 160 on the uncoated TCO strip 170 (shown in FIGS. 1-2) and the wavy surface of that portion of the stretchable substrate in the gap between adjacent cells. Alternatively, stretchable interconnection 180 may comprise a coiled or hinged metal wire, a flexible and/or stretchable conductive contact, or a hinged metal connector. Stretchable interconnection 180 connects the cell to the adjacent solar cell either in series or in parallel, depending on the voltage and current specifications required for the application. Such an interconnect enables the module to stretch and bend between adjacent flexible perovskite solar cells without stressing/breaking the metal interconnect. To encapsulate the contacts, top stretchable layer 240, preferably comprising a material such as PDMS, is deposited using at least one of spin-coating, slot-die coating, drop-casting, or blade-coating.

FIGS. 4A and 4B show series and parallel interconnections of PSCs respectively. As shown in FIG. 4A, for a series connection the stretchable interconnect is connected between the top contact (conductive layer 100) and the bottom contact (TCO layer 140) of adjacent flexible perovskite solar cells. For parallel connection, the stretchable interconnect is connected between adjacent flexible perovskite solar cells twice, where one connection is used to connect the top contacts of adjacent cells and one is used to connect the bottom contacts of adjacent cells, as shown in FIG. 4B.

Figure 5A:
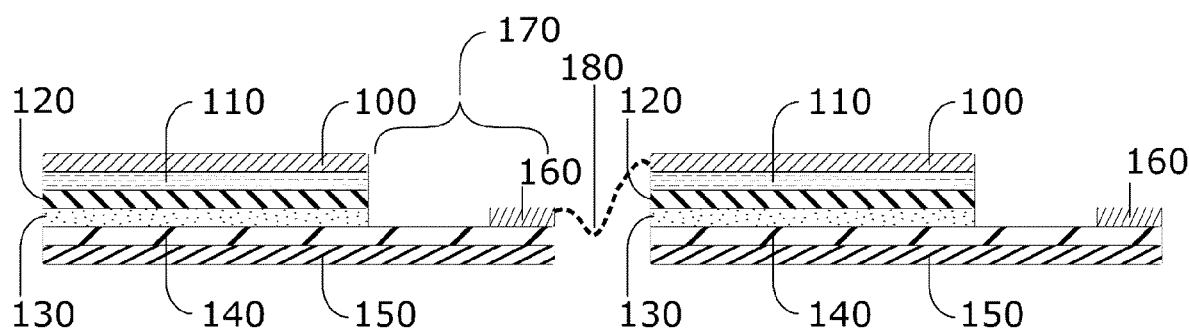
FIG. 5A shows the interconnection before bending and stretching.
Figure 5B:
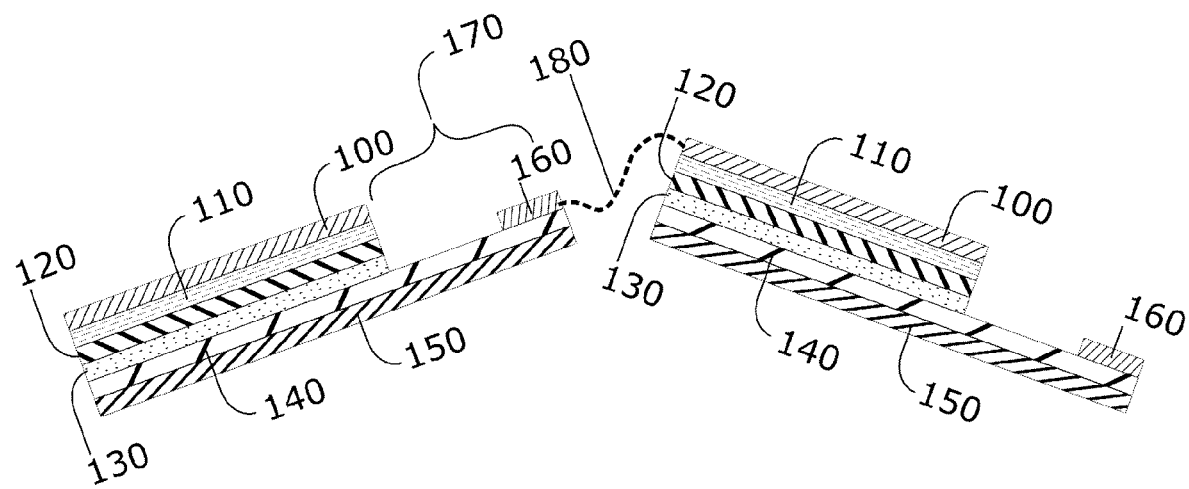
FIG. 5B shows the interconnection after bending and stretching. The perovskite cell on the flexible substrate can bend, and the electrical interconnect can bend and stretch.

FIGS. 5A-5B illustrate a solar module of the present invention before and after bending and/or stretching, respectively, showing the resultant deformation of stretchable interconnection 180. The perovskite solar module of the present invention is preferably flexible in at least two directions and stretchable in one or more directions. In this interconnection scheme, the flexibility of the PSC itself generates the first degree of bend, and the stretchable substrate and top stretchable layer (not shown), which comprises the encapsulated conductive interconnects, generates the second degree of bend and at least one degree of stretch.

Figure 6:
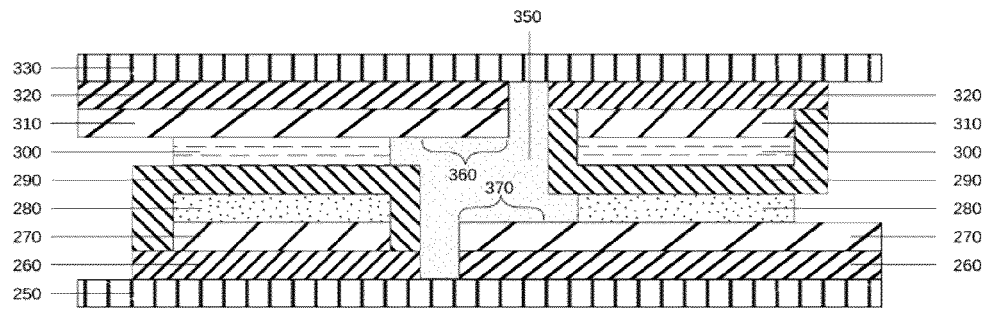
FIG. 6 shows an alternative embodiment of the present invention where the interconnect is preferably formed using a conductive paste to electrically connect adjacent cells serially.

FIG. 6 illustrates an alternative embodiment of the present invention depicting a series interconnection between two PSCs. Flexible substrate 260 preferably comprises PET. TCO layer 270 is preferably deposited on flexible substrate 260 to form one of the electrical contacts of the PSC. TCO layers 270 may comprise, for example, indium tin oxide (ITO), silver nanowires, single-layer graphene, graphene nanoplates, and/or combinations thereof, together with flexible substrate 260 preferably forming a transparent, flexible, and conductive composite substrate. ETL 280 may comprise any material, including but not limited to a transition metal oxide such as $TiO_2$, $SnO_2$, ZnO, $In_2O_3$, $Ga_2O_3$, or CdO. Perovskite layer 290 preferably comprises the ABX3 structure, where A is a cation comprising, for example, methylammonium, formamidinium, cesium, or rubidium; B is a cation comprising, for example, lead or tin; and X is an anion comprising, for example, an iodide, bromide or chloride. HTL 300 preferably comprises 2,2',7,7'-Tetrakis[N,N-di(4-methoxyphenyl)amino]-9,9'-spirobifluorene (spiro-OMeTAD), [6,6]-phenyl C61 butyric acid methyl ester (PCBM), nickel oxide, or a graphite slurry that includes additives such as carbon black to increase the conductivity. IF HTL 300 is not sufficiently conductive, conductive layer 310, preferably comprising TCO similar to TCO layer 270, forms the other electrical contact of the PSC. Conductive layer 310 is preferably covered by flexible layer 320 which preferably comprises a flexible, transparent material such as PET.

The PSCs in this embodiment preferably provide access to the top contact (anode) and bottom contact (cathode) of cells that are adjacent by leaving strips 360 and 370 of TCO layer 270 and conductive layer 310 exposed. This is preferably accomplished by processing ETL 280, perovskite layer 290, HTL 300, conductive layer 310, and transparent flexible layer 320 in strips using, for example, slot-die coating, which can be configured to leave strips 360, 370 uncoated by the subsequent layers. Alternatively, mechanical etching or laser scribing can be used to remove ETL 280, perovskite layer 290, HTL 300, conductive layer 310, and transparent flexible layer 320 to create strips 360 and 370. Strips 360 and 370 are each preferably approximately between 1 μm and 10 mm wide, and more preferably about 1 mm wide. The longer top contact (conductive layer 310) of the left cell is then preferably electrically connected to the longer bottom contact (TCO layer 270) of the adjacent right cell via conductive paste 350, which preferably comprises silver, carbon, or any other material that can form a conductive paste, forming a series interconnection. Electrical isolation is preferably achieved between the bottom contact (TCO layer 270) of the left cell and top contact (conductive layer 310) of the adjacent right cell by configuring the deposition of perovskite layer 290 on each cell, which is electrically insulating, to electrically isolate the aforesaid layers from conductive paste 350. The interconnection so formed thus produces a series connection between adjacent cells.

The cells are laid on stretchable substrate 250, which preferably comprises a stretchable polymer such as vinyl, PDMS, or the like, preferably in an alternating manner. The gap between the cells is preferably between about 1 mm and about 10 mm. After conductive paste 350 is disposed between the cells, to encapsulate the cells and contacts, a final stretchable layer 330, also preferably comprising an insulating material such as vinyl, PDMS, or the like, is preferably laid on top. The entire structure can now be used to cover a curved or otherwise contoured surface while closely conforming to its contours. A final heat treatment not exceeding the melting point of the constituent components of the module may be required for curing the conductive paste after laying the structure down on the target curved surface.

Figure 7:
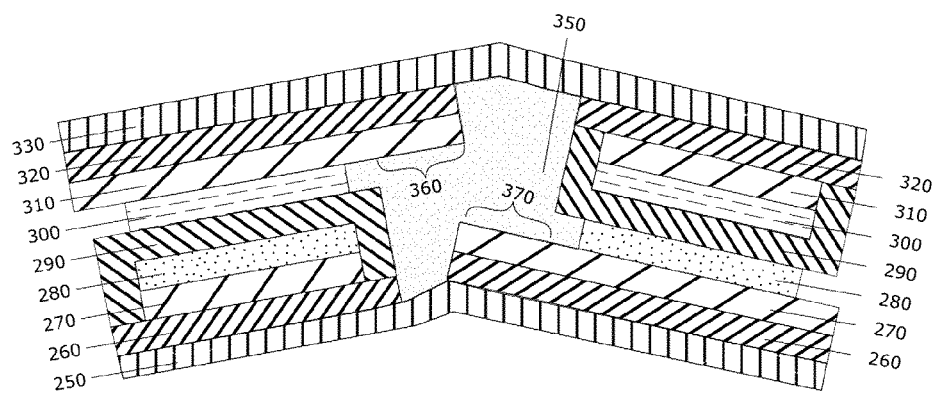
FIG. 7 shows a module similar to that of FIG. 6 after bending and stretching. The perovskite cell on the flexible substrate can bend, and the stretchable substrate/electrical interconnect can bend and stretch.

FIG. 7 illustrates a solar module similar to that shown in FIG. 6 (showing that flexible layer 320 may comprise a different material than that of flexible substrate 260) after bending and/or stretching, showing the resultant deformation of both stretchable substrate 250, stretchable layer 330, and deformable conductive paste 350. The perovskite solar module is preferably flexible in at least two directions, and stretchable in one or more directions. In this interconnection scheme, the flexibility of the PSC itself preferably generates the first degree of bend, and stretchable substrate 250 together with the conductive paste generates the second degree of bend and at least one degree of stretch. The versatility of the roll-to-roll perovskite manufacturing process to fabricate flexible perovskite solar cells also results in the opportunity to custom design the length of the solar cell to reduce the number of manufacturing steps required to form-fit complex contoured surfaces. It also increases design flexibility by enabling the length of the solar cell to be determined by the current-matching criteria of the solar module.

Figure 8:
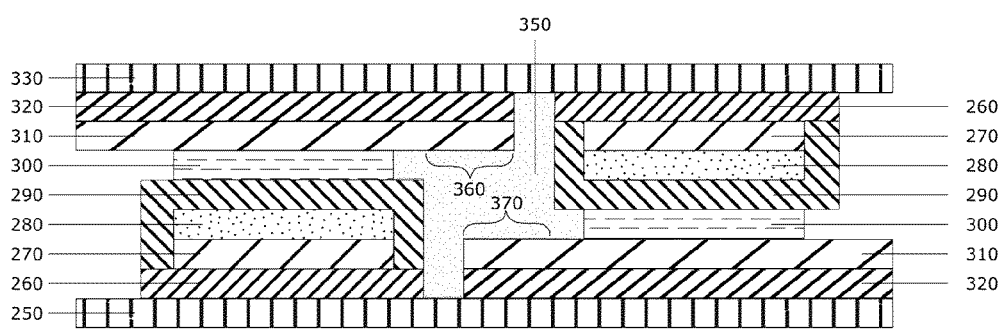
FIG. 8 shows the alternative embodiment of the present invention where the interconnect is preferably formed using a conductive paste to electrically connect adjacent cells in parallel.

FIG. 8 shows two adjacent cells connected in parallel in a manner similar to the serial connection shown in FIG. 6. For parallel interconnection, every alternate cell is produced by changing the order of deposition to alternate the ETL 280 with HTL 300 as shown.

Figure 9A:
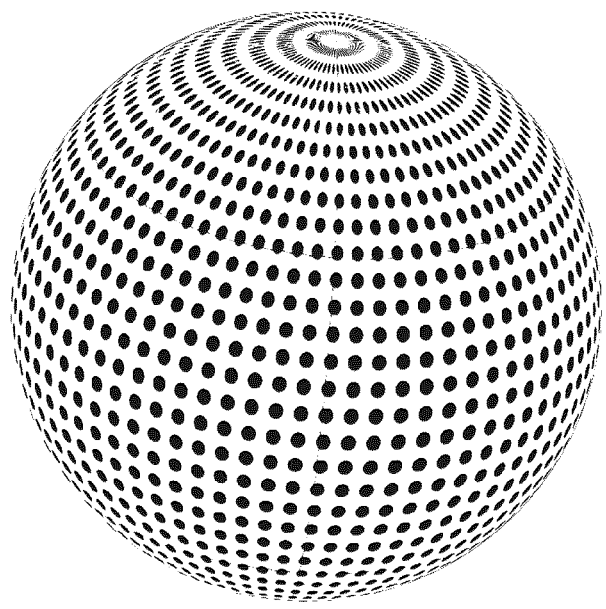
FIGS. 9A-9B show several examples of complex, or 'organic', contours that require more than one degree of bend, and at least one degree of stretch to form-fit a coating on the surface.
Figure 9B:
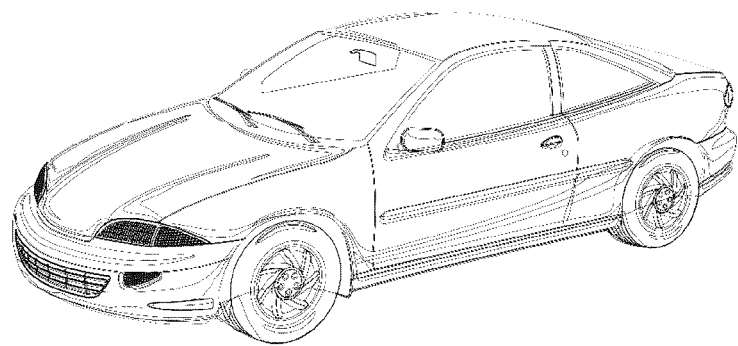

FIGS. 9A and 9B illustrate some different contour shapes that require different degrees of flex and stretch. Complex 'organic' contours have more than one degree of orthogonal flex. For a film or fabric to flex in more than one direction simultaneously, a degree of stretch is required to reduce the inevitable occurrence of crumpling or tearing of the film or fabric. The surface application of substrates that are flexible are limited in this regard, as they are unable to form to complex contours that flex along more than one axis, known as 'compound contours'. These complex contours are very common among modern design, as they form what are known as 'organic' shapes. The amount of stretch that is required to form to a complex contour is defined by the severity of the surface curvature. If the surface curvature is more dramatic, the amount of stretch required to form-fit the substrate to the surface is increased. The perovskite-based modules of the present invention can be form-fit to a substantially higher degree on complex curved surfaces.

Note that in the specification and claims, "about" or "approximately" means within twenty percent (20%) of the numerical amount cited. As used herein, the singular forms "a," "an," and "the" include plural referents unless the context clearly dictates otherwise. Thus, for example, reference to "a functional group" refers to one or more functional groups, and reference to "the method" includes reference to equivalent steps and methods that would be understood and appreciated by those skilled in the art, and so forth.

Although the invention has been described in detail with particular reference to the disclosed embodiments, other embodiments can achieve the same results. Variations and modifications of the present invention will be obvious to those skilled in the art and it is intended to cover all such modifications and equivalents. The entire disclosures of all patents and publications cited above are hereby incorporated by reference.

What is claimed is:

1. A flexible and stretchable solar module comprising:
 a first flexible perovskite solar cell and a second flexible perovskite solar cell disposed on a stretchable substrate, each flexible perovskite solar cell comprising an exposed portion of a first conductive layer or an exposed portion of a second conductive layer; and
 an interconnect comprising a conductive paste disposed between the first flexible perovskite solar cell and the second flexible perovskite solar cell, the conductive paste deformable prior to curing;
 wherein the conductive paste electrically connects the exposed portion of the second conductive layer of the first flexible perovskite solar cell and the exposed portion of the first conductive layer of or the second conductive layer of the second flexible perovskite solar cell; and
 wherein perovskite forming a perovskite layer of the first flexible perovskite solar cell is extended to electrically insulate from the conductive paste those layers of the first flexible perovskite solar cell which are not adjacent to the second conductive layer of the first flexible perovskite solar cell, and perovskite forming a perovskite layer of the second flexible perovskite solar cell is extended to electrically insulate from the conductive paste those layers of the second flexible perovskite solar cell which are not adjacent to the first conductive layer of the second flexible perovskite solar cell or the second conductive layer of the second flexible perovskite solar cell.

2. The solar module of claim 1 wherein the stretchable substrate comprises polydimethylsiloxane (PDMS) or vinyl.

3. The solar module of claim 1 capable of conforming to a contoured surface of an object prior to curing of the conductive paste.

4. The solar module of claim 1 wherein the first conductive layer and/or the second conductive layer of each flexible perovskite solar cell is selected from the group consisting of transparent conductive oxide (TCO), indium tin oxide (ITO), silver nanowires, single-layer graphene, graphene nanoplates, and combinations thereof.

5. The solar module of claim 4 wherein the first conductive layer of each flexible perovskite solar cell comprises TCO, wherein the TCO is coated on a flexible substrate.

6. The solar module of claim 1 wherein said exposed portion of the first conductive layer or the second conductive layer of each solar cell is not covered by other layers of the solar cell.

7. The solar module of claim 6 wherein said exposed portion of the first conductive layer or the second conductive layer of each flexible perovskite solar cell is formed by removing the other layers from said exposed portion of the first conductive layer or the second conductive layer by mechanical etching or laser scribing.

8. The solar module of claim 7 wherein the other layers comprise an electron transport layer (ETL), a perovskite layer, a hole transport layer (HTL), and the first conductive layer.

9. The solar module of claim 1 wherein each of the solar cells was manufactured using slot-die coating.

10. The solar module of claim 1 wherein said exposed portion of the first conductive layer or the second conductive layer of each flexible perovskite solar cell is between approximately 1 μm and approximately 10 mm wide.

11. The solar module of claim 10 wherein said exposed portion of the first conductive layer or the second conductive layer of each flexible perovskite solar cell is approximately 1 mm wide.

12. The solar module of claim 1 wherein said exposed portion of the second conductive layer on the first flexible perovskite solar cell and said exposed portion of the first conductive layer on the second flexible perovskite solar cell spatially overlap but are not in physical contact.

13. The solar module of claim 1 wherein an order of layers in each solar cell is the same but the exposed portion of the second conductive layer in the first flexible perovskite solar cell is facing downward from a top portion of the first flexible perovskite solar cell and the exposed portion of the first conductive layer in the second flexible perovskite solar cell is facing upward from a bottom portion of the second flexible perovskite solar cell.

14. The solar module of claim 1 wherein the first flexible perovskite solar cell is inverted on the stretchable substrate with respect to the second flexible perovskite solar cell.

15. The solar module of claim 14 wherein positions of an HTL and an ETL in the first flexible perovskite solar cell are exchanged with respect to positions of an HTL and an ETL in the second flexible perovskite solar cell.

16. The solar module of claim 1 wherein the solar module is conformed to a contoured surface prior to curing of the conductive paste.

17. The solar module of claim 1 further comprising a stretchable layer covering the first flexible perovskite solar cell, the second flexible perovskite solar cell, and the conductive paste.

18. A method of manufacturing a flexible and stretchable solar cell, the method comprising:
producing first and second flexible perovskite solar cells, each flexible perovskite solar cell comprising an exposed portion of a first conductive layer or an exposed portion of a second conductive layer;
placing the first flexible perovskite solar cell and the second flexible solar cell on a stretchable substrate; and
electrically connecting the exposed portion of the second conductive layer of the first flexible perovskite solar cell and the exposed portion of the first conductive layer or the second conductive layer of the second flexible solar cell with an interconnect, the interconnect comprising a conductive paste disposed between the first flexible perovskite solar cell and the second flexible perovskite solar cell;
extending a perovskite layer of the first flexible perovskite solar cell to electrically insulate from the conductive paste those layers of the first flexible perovskite solar cell which are not adjacent to the second conductive layer of the first flexible perovskite solar cell; and
extending a perovskite layer of the second flexible perovskite solar cell to electrically insulate from the conductive paste those layers of the second flexible perovskite solar cell which are not adjacent to the first conductive layer of the second flexible perovskite solar cell or the second conductive layer of the second flexible perovskite solar cell;
wherein the paste is deformable prior to curing.

19. The method of claim 18 wherein the stretchable substrate comprises PDMS or vinyl.

20. The method of claim 18 wherein the producing step comprises slot-die coating.

21. The method of claim 18 wherein the producing step comprises removing other layers from the first conductive layer or the second conductive layer of each flexible perovskite solar cell using mechanical etching or laser scribing to produce the exposed portion of the corresponding conductive layer of each of the flexible perovskite solar cells.

22. The method of claim 18 further comprising encapsulating the first flexible perovskite solar cell, the second flexible perovskite solar cell, and the deformable interconnect in a stretchable cover layer.

23. The method of claim 22 further comprising:
conforming the solar module to a contoured surface of an object; and
curing the conductive paste.

24. The method of claim 18 comprising spatially overlapping but not directly contacting the exposed portion of the second conductive layer on the first flexible perovskite solar cell and the exposed portion of the first conductive layer on the second flexible perovskite solar cell.

25. The method of claim 18 wherein the placing step comprises inverting the first flexible perovskite solar cell with respect to the second flexible perovskite solar cell.

* * * * *